United States Patent [19]

Tomizuka et al.

[11] Patent Number: 5,111,274
[45] Date of Patent: May 5, 1992

[54] SEMICONDUCTOR INTEGRATED CIRCUIT WITH CIRCUIT BLOCKS, DUMMY ISLANDS, AND BIAS AND SHIELD ELECTRODES

[75] Inventors: Kazuo Tomizuka; Sakae Sugayama; Takao Saeki, all of Gunma; Fumio Sandoh, Tochigi, all of Japan

[73] Assignee: Sanyo Electric Co., Ltd., Osaka, Japan

[21] Appl. No.: 602,184

[22] Filed: Oct. 23, 1990

Related U.S. Application Data

[62] Division of Ser. No. 378,397, Jul. 11, 1989, Pat. No. 5,050,238.

[30] Foreign Application Priority Data

Jul. 12, 1988 [JP] Japan .................................. 63-173007
Aug. 12, 1988 [JP] Japan .................................. 63-202197
Nov. 17, 1988 [JP] Japan .................................. 63-291450

[51] Int. Cl.⁵ .................... H01L 29/40; H01L 27/04; H01L 29/34; H01L 25/04
[52] U.S. Cl. .................................. 357/53; 357/48; 357/54; 357/71; 357/84
[58] Field of Search .................. 357/48, 84, 53, 54, 357/71

[56] References Cited

U.S. PATENT DOCUMENTS

| | | | |
|---|---|---|---|
| 4,146,905 | 3/1979 | Appels et al. | 357/48 |
| 4,212,025 | 7/1984 | Hirasawa et al. | 357/48 |
| 4,303,932 | 12/1981 | Johannsen | 357/48 |
| 4,412,238 | 10/1983 | Khadder et al. | 357/48 |
| 4,628,343 | 12/1986 | Komatsu | 357/84 |
| 4,970,565 | 11/1990 | Wu et al. | 357/84 |

FOREIGN PATENT DOCUMENTS

61-276365 12/1986 Japan .................................. 357/84

OTHER PUBLICATIONS

Millman et al., Microelectronics, 2nd edition, pp. 41-45, and 182-183, published by McGraw-Hill.

Primary Examiner—J. Carroll
Attorney, Agent, or Firm—Darby & Darby

[57] ABSTRACT

A semiconductor integrated circuit for a radio comprises: a front end circuit block (1) including at least an oscillation circuit (1b) and a mixing circuit (1c), for converting an RF signal to an IF signal; and an IF amplifying circuit block (2) for amplifying the IF signal and limiting an amplitude thereof, and the front end circuit block (1) is covered with shield electrodes (17, 17a, 17b, 17c) connected to a predetermined potential.

3 Claims, 12 Drawing Sheets

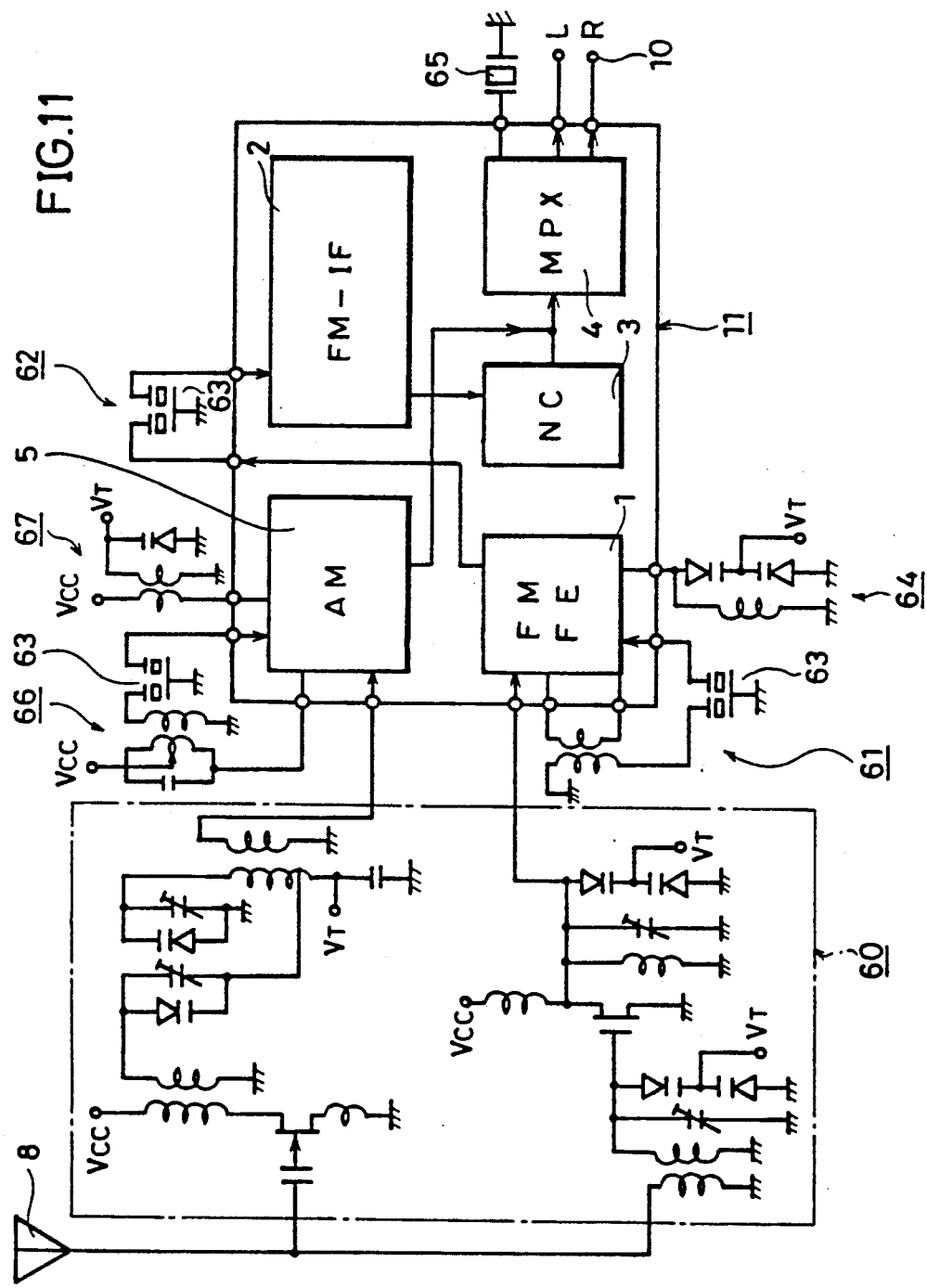

SEMICONDUCTOR INTEGRATED CIRCUIT WITH CIRCUIT BLOCKS, DUMMY ISLANDS, AND BIAS AND SHIELD ELECTRODES

This is a division of application Ser. No. 378,397, filed July 11, 1989, now U.S. Pat. No. 5,050,238.

BACKGROUND OF THE INVENTION

1. Field of the Invention

The present invention relates to a semiconductor integrated circuit (IC) including a plurality of circuit blocks for processing signals of different frequencies or levels, and particularly to an improvement for preventing mutual interference between the circuit blocks.

2. Description of the Background Art

Electronic apparatus such as TV tuners or FM/AM tuners need to reproduce an audio signal of a relatively low frequency from a high radio frequency (RF) signal. Consequently such an electronic apparatus often includes a plurality of circuit blocks for processing signals having different frequency bands. For instance, FM tuners used in Japan need to process various signals in a wide frequency range of 20 Hz to 90 MHz including an RF signal of 76 to 90 MHz, an intermediate frequency (IF) signal of 10.7 MHz and an audio signal of 20 to 20,000 Hz.

FIG. 1 is a circuit block diagram showing an example of an FM/AM tuner. An RF signal is received by an antenna 8. An FM front end circuit block 1 which converts a received FM signal to an IF signal includes an RF amplifying circuit 1a, an oscillation circuit 1b and a mixing circuit 1c. The mixing circuit 1c mixes the FM signal amplified by the RF amplifying circuit 1a with an oscillation frequency signal applied from the oscillation circuit 1b and outputs an IF signal. The FM-IF amplifying circuit block 2 limits an amplitude of the IF signal after amplification of the IF signal and then it detects and outputs a stereo composite signal. A multiplex decoder block 4 receives the stereo composite signal through a noise canceller block 3 and demodulates the stereo signal, so that it applies left-channel and right-channel audio signals to respective output terminals 10 constituting a pair. An AM tuner block 5 outputs an audio signal from an AM signal received by the antenna 8.

In recent years, there is an increasing demand for reduction of sizes and enhancement of performance of electronic apparatus. Accordingly, it is desired that all the circuit blocks of the FM/AM tuner in FIG. 1 should be incorporated in one semiconductor chip. However, since the FM front end block 1 processes a high frequency signal of several tens MHz, undesirable radiation is liable to occur, exerting adverse effect on other circuit blocks. On the other hand, since the FM front end block 1 also processes a very low level signal received by the antenna 8, the operation of the block 1 is liable to be unstable due to mutual interference with other circuit blocks and undesirable oscillation might occur in some cases. Accordingly, it is difficult to incorporate the FM front end block 1 in the same semiconductor chip where the other circuit blocks are formed.

FIG. 2 is a schematic sectional view showing a conventional structure for reducing mutual interference between respective circuit blocks in a semiconductor IC. An epitaxial N layer 52 is formed on a P⁻ semiconductor substrate 51. The epitaxial N layer 52 is covered with an insulating film 55. Right and left islands 58 and 59 where different circuit blocks are formed in the epitaxial N layer 52 are isolated by a pair of P+ isolation regions 54. A dummy island 53 is provided between the isolation regions 54. Transistors, diodes, capacitors, resistors etc. (not shown) are integrated in each of the circuit block regions 58 and 59. Each of the P+ isolation regions 54 of the pair is electrically connected with a ground line 57 through an opening 56.

Leakage current from each of the circuit block regions 58 and 59 is absorbed by the corresponding ground line 57 through the P+ isolation region 54 as shown by the arrows of broken lines in FIG. 2. Consequently, mutual interference due to the leakage current can be prevented between the adjacent circuit blocks 58 and 59. However, if the leakage current is increased, an amount of current flowing in the respective P+ isolation regions 54 increase, causing an increase of potential in the P+ isolation regions 54 due to the impedance of the ground lines 57. In such a case, the P+ isolation regions 54 cannot entirely absorb the leakage current, resulting in a flow of leakage current between the circuit blocks 58 and 59 through the P⁻ substrate 51. In consequence, the mutual interference between the circuit blocks 58 and 59 cannot be prevented satisfactorily.

In these days, various electronic apparatuses are desired and it is requested to reduce the time for design of semiconductor IC circuit patterns. For example, it is often desired to make changes such as removal, replacement or addition of a specified circuit block in a semiconductor IC. However, the plurality of circuit blocks on the semiconductor chip do not always have the same area and accordingly it is often necessary to redesign the circuit pattern of the whole semiconductor IC due to the removal, replacement, addition or the like of a specified circuit block.

SUMMARY OF THE INVENTION

In view of the above described prior art, an object of the present invention is to provide a semiconductor IC in which mutual interference between circuit blocks is minimized.

Another object of the present invention is to provide a semiconductor IC having a pattern layout applicable to various custom IC's.

According to an aspect of the present invention, a semiconductor IC for a radio receiver includes a front end circuit block including at least an oscillation circuit and a mixing circuit for converting an RF signal to an IF signal, and an IF amplifying circuit block for amplifying the IF signal and limiting the amplitude thereof, the front end circuit block being covered with a shield electrode connected to a predetermined potential.

According to another aspect of the invention, a semiconductor IC includes a plurality of circuit blocks formed on a semiconductor chip, and at least the first circuit block of the plurality of circuit blocks is surrounded by a dummy island and includes a reverse bias electrode for applying a predetermined reverse bias potential to the dummy island and a shield electrode covering the first circuit block and connected to the reverse bias electrode.

According to a further aspect of the invention, a semiconductor IC includes at least first and second circuit blocks formed on a semiconductor chip, first and second dummy islands surrounding the first and second circuit blocks, respectively, first and second power supply lines for applying a reverse bias potential to the first and second dummy islands between the first and second circuit blocks, an isolation region for isolating the first and second dummy islands from each other between the first and second circuit blocks and an absorption electrode connected to the isolation region for absorbing leakage current.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a block circuit diagram of an FM/AM receiver including a semiconductor IC according to the present invention.

DESCRIPTION OF THE PREFERRED EMBODIMENTS

Figure 3:
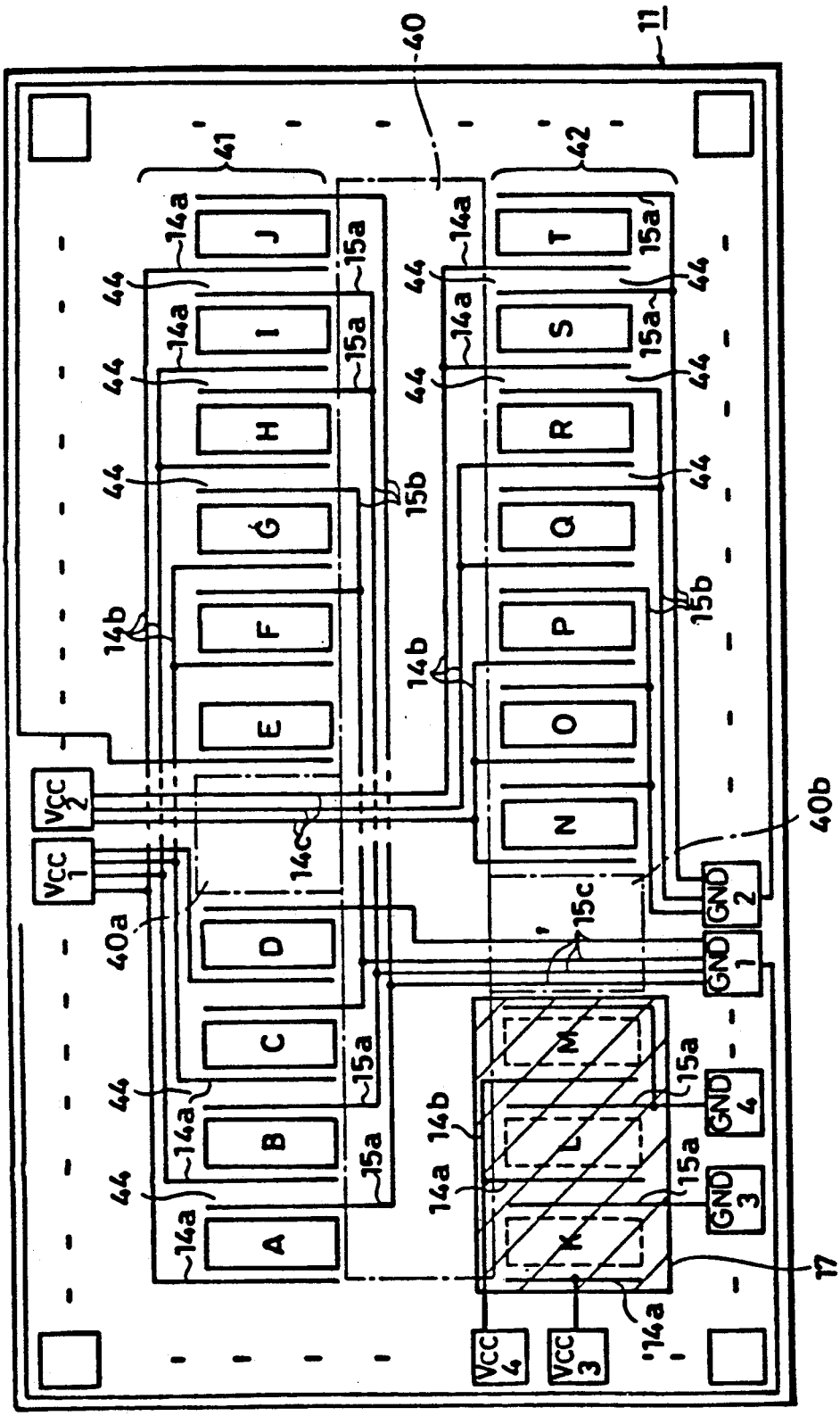
FIG. 3 is a top view showing schematically a semiconductor IC according to one embodiment of the present invention.

Referring to FIG. 3, a top view of a semiconductor IC according to an embodiment of the present invention is schematically illustrated. A semiconductor chip 11 is divided into first and second regions 41 and 42 by a division region 40 shown by chain lines. Mat regions A to J spaced from each other by partition belts 44 are provided on the first region 41, and a plurality of circuit elements such as transistors, diodes, capacitors and resistors (not shown) are formed on each of those mats A to J. A pair of power supply line 14a and ground line 15a parallel to each other are normally provided on each of the partition belts 44. Normally, a power supply line 14a is provided adjacent to the left side of each of the mats A to J and a ground line 15a is provided adjacent to the right side thereof. Similarly, mats K to T are formed on the second region 42.

Figure 1:
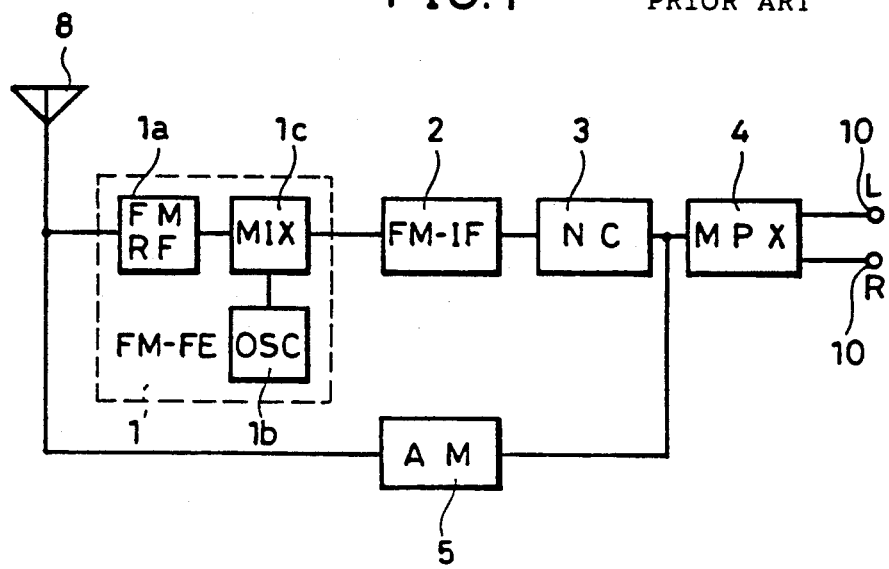
FIG. 1 is a circuit diagram showing an FM/AM tuner.
Figure 2:
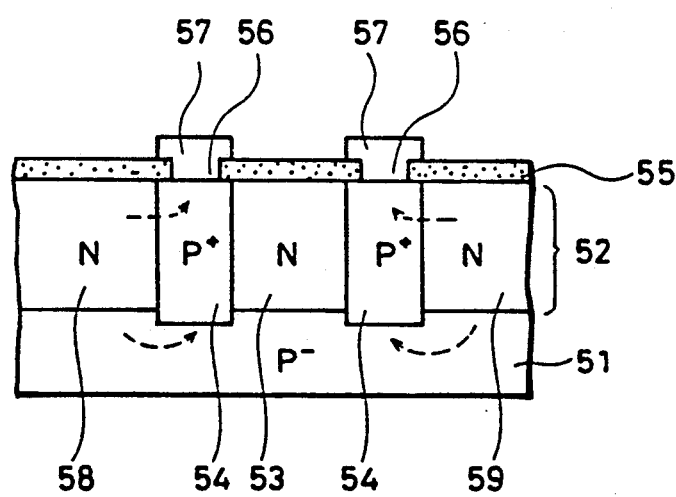
FIG. 2 is a schematic partial sectional view showing a conventional structure for reducing mutual interference between circuit blocks in a semiconductor IC in the prior art.

Each of the mats A to T has substantially the same rectangular form and size. For example, each of the shorter sides of each mat is set to a length permitting six bipolar transistors to be arranged. Each longer side of each mat is set to a length permitting the corresponding mat to include about 100 circuit elements easy to handle in design. However, the size of each mat can be set to any suitable size permitting the mat to include a preferred number of circuit elements according to the circuit block incorporated in an IC device. All the circuit blocks 1 to 5 of the FM/AM tuner in FIG. 1 are integrated in the semiconductor chip 11 in FIG. 3.

The FM front end block 1 which includes about 250 circuit elements is formed in the mats K, L, M. The FM-IF amplifying circuit block 2 which includes about 430 circuit elements is formed in the mats E, F, G, H, I. The noise canceller block 3 which includes about 270 circuit elements is formed in the mats N, 0, P. The multiplex decoder block 4 which includes about 390 circuit elements is formed in the mats Q, R, S, T. The AM tuner block 5 which includes about 350 circuit elements is formed in the mats A, B, C, D. An optional circuit desired by the user can be incorporated in the mat J.

Each of the power supply lines 14a on the partition belts 44 is connected to one line of a bundle 14b of power supply lines extending along the upper side of the semiconductor chip 11 or the lower side of the division region 40. The bundle 14b of power supply lines is connected to the corresponding one of the first and second power supply pads Vcc1, and Vcc2. If a circuit formed in a plurality of mats allows the power supply lines for supplying electric power thereto to have a common impedance, the power supply lines 14a extending along those mats are connected to the same line of the bundle 14b. Similarly, each of the ground lines 15a on the partition belts 44 is connected to one line of a bundle 15b of ground lines extending along the lower side of the semiconductor chip 11 or the upper side of the division region. The bundle 15b of ground lines is connected to the corresponding one of the first and second ground pads GND1, GND2.

The power supply lines of the bundle 14b and the ground lines of the bundle 15b are formed with relatively large widths on the division region 40 in order to reduce conductor impedance. Accordingly, the division region 40 needs to have a relatively large width. The large width of the division region 40 serves to space the mat group A-J from the other mat group K-T and accordingly it serves to reduce mutual interference between the circuit blocks included in the mat group A-J and the circuit blocks included in the other mat group K-T.

In some cases, the division region 40 may include additional division regions extending between the mats of the first region 41 or the second region 42. For instance, referring to FIG. 3, an additional division region 40a may be provided between the mats D and E and similarly an additional division region 40b may be provided between the mats M and N. Those additional division regions 40a and 40b separate the mats K to M including the FM front end block 1 from the mat groups E-J and N-T and accordingly those additional division regions serve to reduce mutual interference between the FM front end block 1 and the circuit blocks included in the mat groups E-J and N-T.

Further, the additional division region 40a can be utilized as a space for arrangement of a bundle 14c of power supply lines for connecting the bundle 14b of the power supply lines on the division region 40 to the second power supply pad Vcc2. Similarly, the other additional division region 40b can be utilized as a space for arrangement of a bundle 15c of ground lines for connecting the bundle 15b of ground lines on the division region 40 to the first ground pad GND1. The bundle 14c of power supply lines and the bundle 15c of ground lines are fixed to corresponding predetermined potentials, which makes it possible to reduce mutual interferences due to undesirable radiation between the circuit blocks, particularly between the FM front end block 1 and the FM-IF amplifying circuit block 2.

The power supply lines 14a, 14b, 14c, the ground lines 15a, 15b, 15c and interconnection lines for the circuit elements in each mat are formed substantially by conductors in a first conductor layer. Interconnection lines among the mats A to T (not shown for the purpose of simplification of the illustration) are formed substantially by conductors in a second conductor layer because those interconnection lines need to cross over the power supply lines 14a to 14c and the ground lines 15a to 15c.

As shown in FIG. 1, the FM front end block 1 includes a high frequency amplifying circuit 1a, an oscillation circuit 1b and a mixing circuit 1c and processes a signal of a very low level such as several $\mu V$ at several tens of MHz. Consequently, the FM front end block 1 is liable to be adversely affected by the FM-IF block 1 which processes a signal of a large amplitude level at 10.7 MHz relatively approximate to several tens of MHz. On the other hand, the oscillation circuit 1b in the FM front end block 1 is liable to cause undesirable radiation to exert unfavorable effect on the other circuit blocks. In consequence, as shown in FIG. 3, the mats K to M where the FM front end block 1 is formed are sufficiently spaced in the diagonal direction of the semiconductor chip 11 from the mats E to I where the FM-IF amplifying circuit block 2 is formed.

The oscillation circuit 1b in the FM front end block 1 is formed in the mat K at the left lower corner of the semiconductor chip in order to avoid mutual interference with other circuit blocks. Further, the power supply line 14a and the ground line 15a provided for the mat K are connected to a third power supply pad Vcc3 and a third ground and GND3, respectively, in order to avoid mutual interference with other mats. The power supply line 14a and the ground line 15a extending along each of the mats L and M are connected to a fourth power supply pad Vcc4 and a fourth ground and GND4, respectively.

The mats K to M including the FM front end block 1 are covered with a shield electrode 17 shown as a hatched area. Since the interconnection lines of the mats K to M are formed by the conductors in the second layer, the shield electrode 17 is formed by a conductor of a third layer and it is connected to the third and/or fourth ground pads GND3 and/or GND 4. The shield electrode 17 absorbs undesirable radiation generated from or applied to the FM front end block 1. Consequently, mutual interference due to undesirable radiation between the FM front end block 1 and other circuit blocks can be reduced. The shield electrode 17 may be connected to the third and/or fourth electrode pads Vcc3 and/or Vcc4, not to the ground pads GND3, GND4, so as to be fixed at a predetermined potential. Further, since high frequency noise passes through a bypass capacitor, the shield electrode 17 may be connected to the ground pads GND3, GND4 or the power supply pads Vcc3, Vcc4 through the bypass capacitor.

In the semiconductor IC as shown in FIG. 3, mats of the substantially same size are disposed in a matrix formed on the semiconductor chip and, accordingly, circuit blocks can be modified added or removed easily. Consequently, circuit blocks used for a large-scale electronic circuit can be separately designed and stocked and, thus, it is possible to considerably reduce the time required for design of a large-scale electronic circuit.

Figure 4:
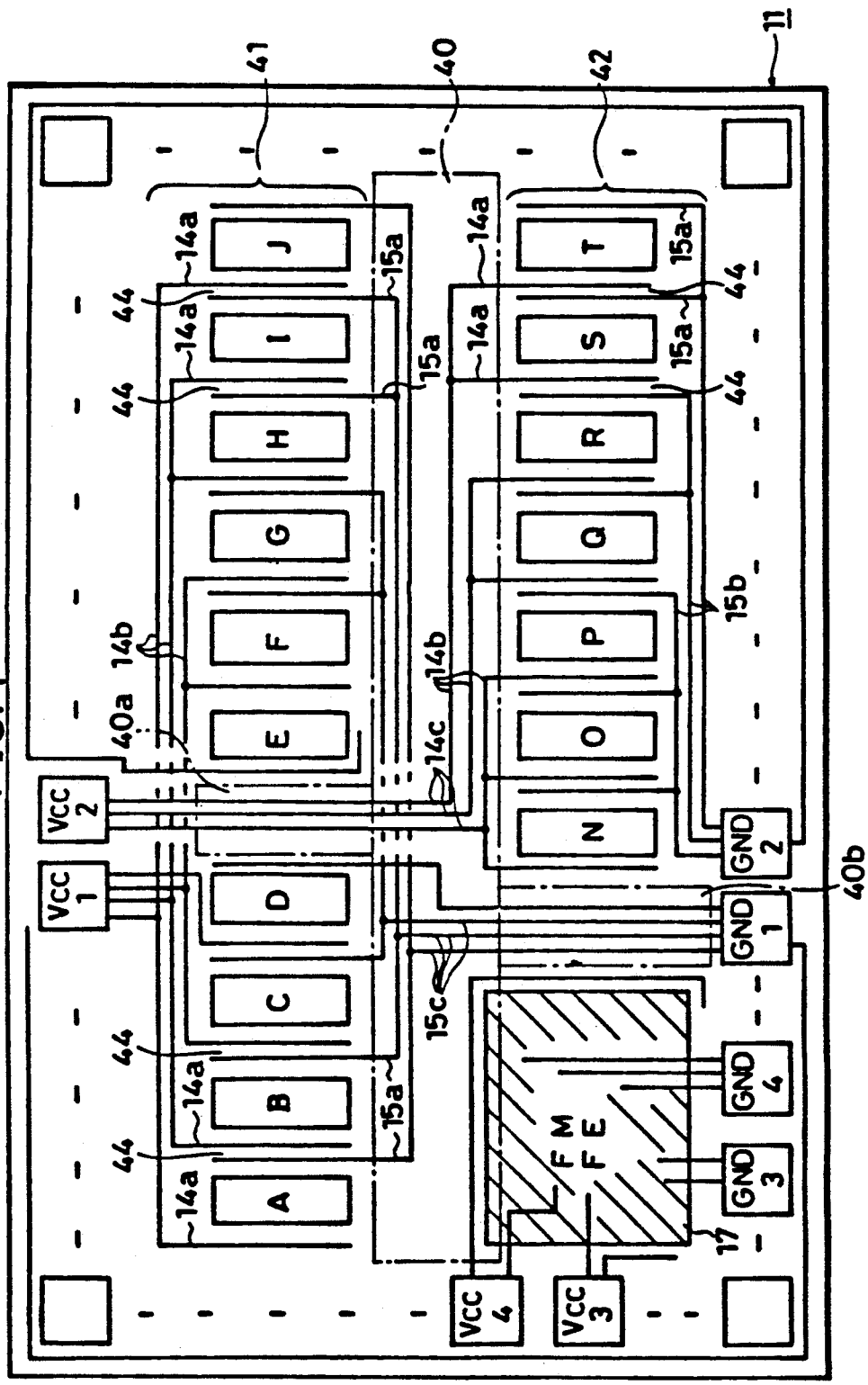
FIG. 4 is a top view showing schematically a semiconductor IC according to another embodiment of the invention.

Referring to FIG. 4, a top view of a semiconductor IC according to another embodiment of the invention is schematically illustrated. The semiconductor IC in FIG. 4 is similar to that in FIG. 3, except that the FM front end block 1 in FIG. 4 is not divided into a plurality of mats. More specifically, the FM front end block 1 is formed in a single area substantially equal to the area occupied by the three mats and that area is covered with a shield electrode 17. Since the FM front end block 1 is not divided into a plurality of mats, interconnection lines among the mats are not required. Accordingly, the shield electrode 17 can be formed by the conductor of the second layer and thus the number of conductor layers can be decreased. In addition, since the single area including the FM front end block 1 corresponds to the area occupied by the three mats, it can be easily replaced by three mats including other circuit block.

Figure 5:
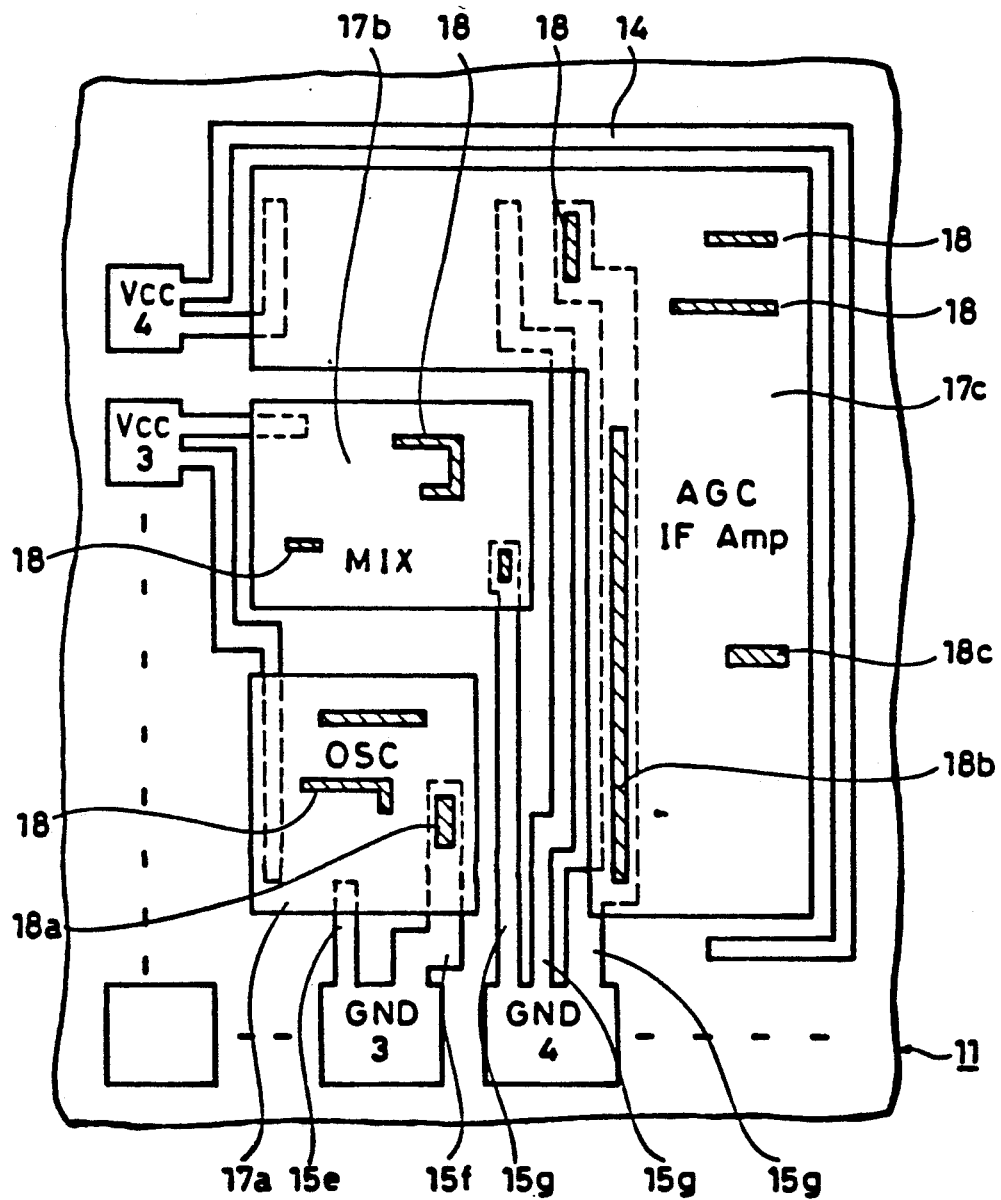
FIG. 5 is a schematic partial top view showing a further embodiment of the invention.

Referring to FIG. 5, a further embodiment of the invention is shown as a schematic partial top view. The FM front end block 1 of this embodiment includes main components such as the oscillation circuit (OSC) 1b and the mixing circuit (MIX) 1c and it often includes additional circuits such as IF amplifying circuit (IF-Amp) for amplifying an IF output signal from the mixing circuit 1c before inputting it to the FM-IF amplifying circuit block 2 and a automatic gain control circuit (AGC) for automatically controlling a received signal level. All of those circuits need to be protected from mutual interference with other circuit blocks, particularly with the FM-IF amplifying circuit block 2. Among those circuits, the oscillation circuit 1b is required to accurately effect high frequency oscillation which is a very unstable operation and thus particular precautions should be taken for this circuit.

Accordingly, an area where the oscillation circuit (OSC) 1b is to be formed is covered with a special (separated) shield electrode 17a. The shield electrode is connected to the corresponding ground line through a through hole in an interlayer insulating film. The shield electrode 17a is separated from shield electrodes 17b, 17c covering other circuit regions and since it does not have a conductor impedance common to that of other shield electrodes 17b, 17c, it is reliably fixed at a ground potential. As a result, the shield electrode 17a serves to make stable the operation of the oscillation circuit 1b and to absorb undesirable radiation from the oscillation circuit 1b. In addition, since the shield electrode 17a is separated from the other shield electrodes 17b, 17c, interference current in the shield electrodes 17b, 17c does not exert any influence on the oscillation circuit (OSC) 1b through the shield electrode 17a. Further, since the shield electrodes 17b, 17c covering other circuits in the FM front end block 1 are disposed between the oscillation circuit (OSC) 1b and the other circuit blocks, it is possible to prevent interference current from other circuit blocks (particularly from the FM-IF amplifying circuit block 2) from affecting the oscillation circuit (OSC) 1b. The separation of the shield electrode 1b covering the mixing circuit 1c from the shield electrode 17c covering the additional circuits such as the AGC or the IF-Amp serve to make further stable the operation of the F front end block 1.

In order to further reduce the mutual interference between the oscillation circuit (OSC) 1b and other circuits in the FM front end block 1, the third ground pad GND3 is utilized only for the oscillation circuit 1b. The circuits other than the oscillation circuit 1b in the FM front end block 1 are connected to the fourth ground pad GND4 through the ground line 15g. The connection point of the shield electrode and the ground line is provided at a position as closest to the corresponding ground pad as possible. This is for the purpose of minimizing the increase of the potential of the shield electrode due to the conductor impedance of the ground line.

Absorption electrodes 18, 18a, 18b, 18c shown as hatched areas in FIG. 5 are in ohmic contact with the underlying P+ isolation regions and absorb leakage current from the circuit regions, to prevent mutual interference due to the leakage current between the respective circuits. The absorption electrodes 18, 18a, 18b, 18c are disposed to absorb the leakage current flowing between the respective circuit regions and such electrodes are also provided near the circuit elements liable to generate leakage current, such as NPN/PNP transistors performing saturation operation, capacitors or resistors. The leakage current absorbed by the absorption electrodes 18, 18a, 18b, 18c is caused to flow into the corresponding ground pad through the ground lines or through the shield electrode and the ground lines. The shield electrodes and the ground lines are connected through the through holes in the interlayer insulating film.

In the oscillation circuit (OSC) 1b, the ground line 15f for applying the ground potential to the shield electrode 17a and to the absorption electrodes 18, 18a is provided separately from the ground line 15e for applying the ground potential to the circuit elements. Accordingly, even if the potential of the ground line 15f is a little increased due to the absorbed leakage current, the stable ground potential can be applied to the circuit elements through the ground line 15e.

Figure 6:
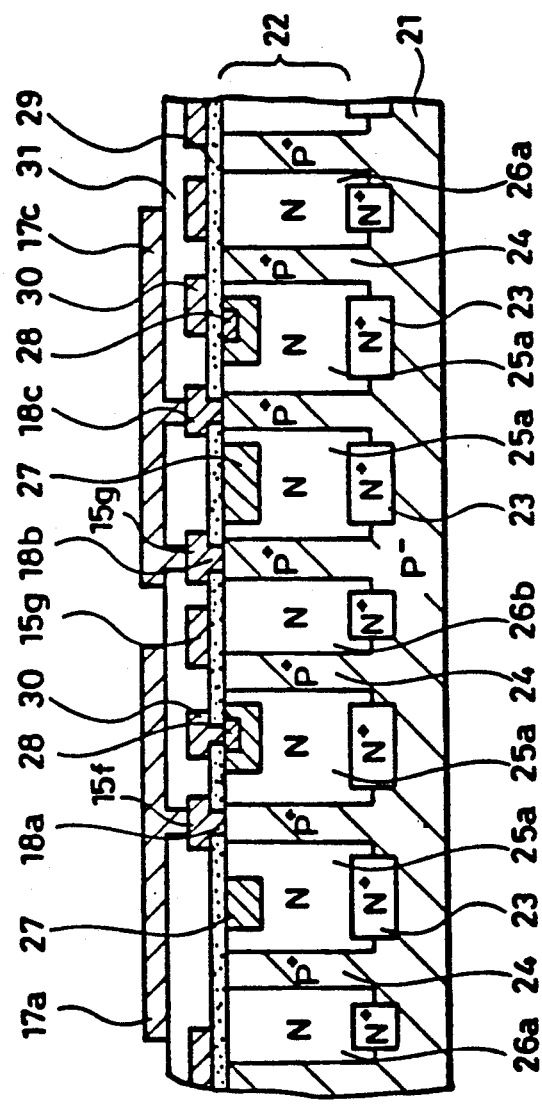
FIG. 6 is a schematic partial sectional view of the FM front end block in FIG. 5

Referring to FIG. 6, a part of the FM front end block 1 in FIG. 5 is illustrated as a schematic sectional view. Burried N+ layer regions 23 are formed on a P− semiconductor substrate 21. An epitaxial N layer 22 is formed to cover the substrate 21 and the burried layer regions 23. The epitaxial N layer 22 is divided into a plurality of islands by P+ isolation regions 24. Circuit elements are formed in the respective islands 25a, while no circuit elements are formed in the dummy islands 26a, 26b. The epitaxial layer 22 is covered with an oxide film 29 formed by a thermal oxidation method or a chemical vapor deposition (CVD) method. The circuit elements are connected by conductors 30 in the first conductor layer through contact holes in the oxide film 29. The conductors 30 can be formed by evaporation of aluminum.

The absorption electrodes 18a and 18b in ohmic contact with the P+ isolation regions 24 are connected directly to the ground lines 15f and 15g of the first conductor layer, respectively. The first conductor layer is covered with an interlayer insulating film 31 formed of an epoxy resin for example and the shield electrodes 17a, 17c are formed on the first conductor layer. The shield electrodes 17a and 17c are connected to the ground lines 15f and 15g, respectively, through the through holes in the interlayer insulating film 31. The absorption electrode 18c spaced from the ground line 15g is connected to the shield electrode 17c through the through hole in the interlayer insulating film. The leakage current absorbed by the absorption electrode 18c flows into the ground line 15g through the shield electrode 17c. Thus, each of the absorption electrodes can be provided in a arbitrary position under the corresponding shield electrode.

The dummy island 26a surrounds the whole area of the FM front end block 1 in order to prevent mutual interference due to leakage current between the FM front end block 1 and other circuit blocks. The dummy island 26b is provided to prevent leakage current between the oscillation circuit 1b and other circuits in the FM front end block 1.

In FIG. 6, only the specified numbers of islands and conductors are shown for the purpose of simplification of the drawing and the positional relation in FIG. 6 does not precisely corresponds to that in FIG. 5.

Figure 7:
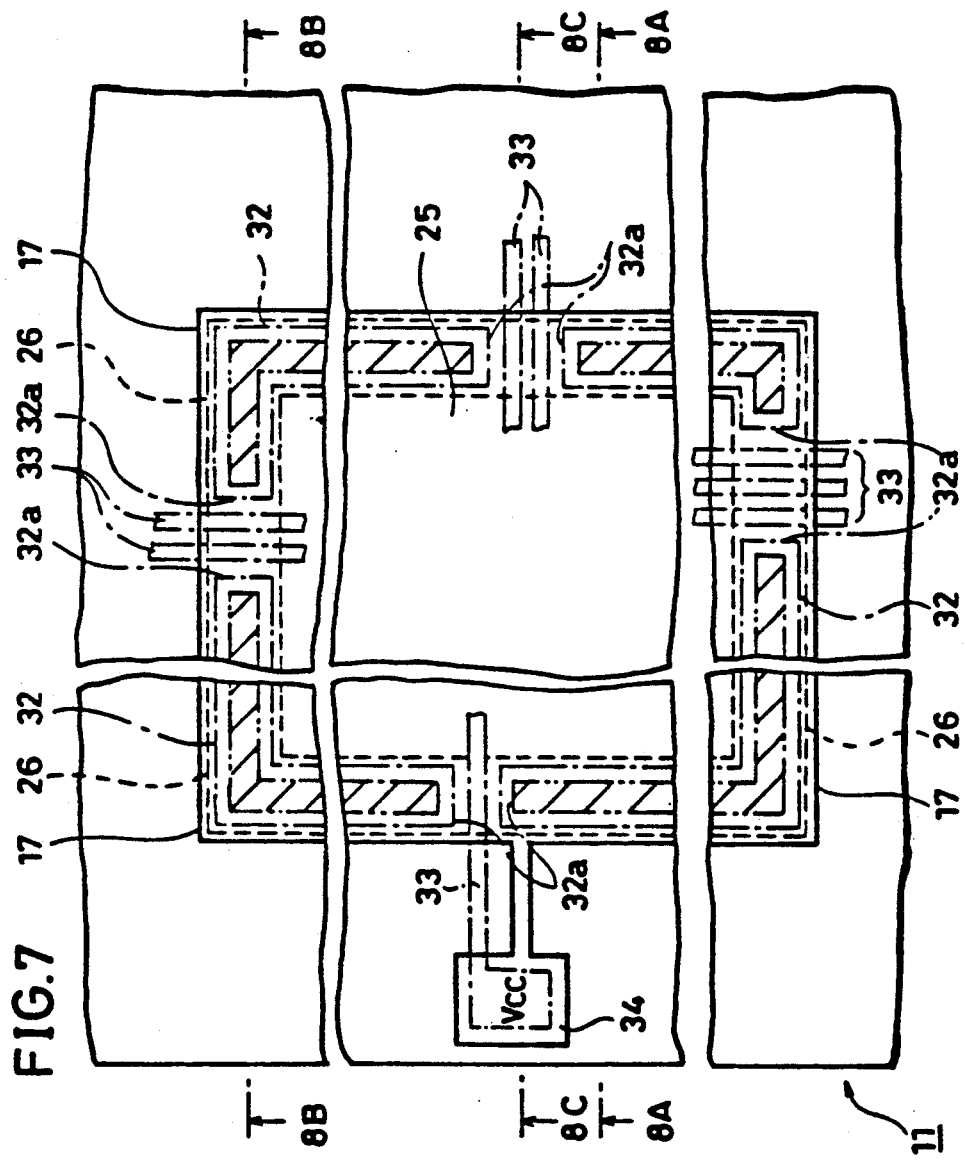
FIG. 7 is a schematic partial top view showing a still further embodiment of the invention.
Figure 8A:
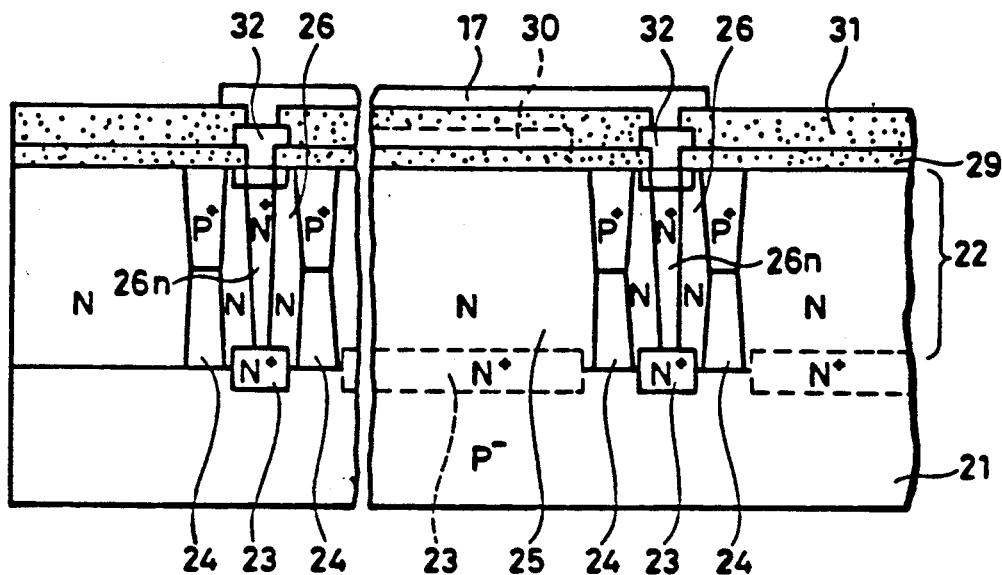
FIGS. 8A, 8B and 8C are schematic sectional views taken along the lines 8A—8A, 8B—8B and 8C—8C in FIG. 7, respectively.
Figure 8B:
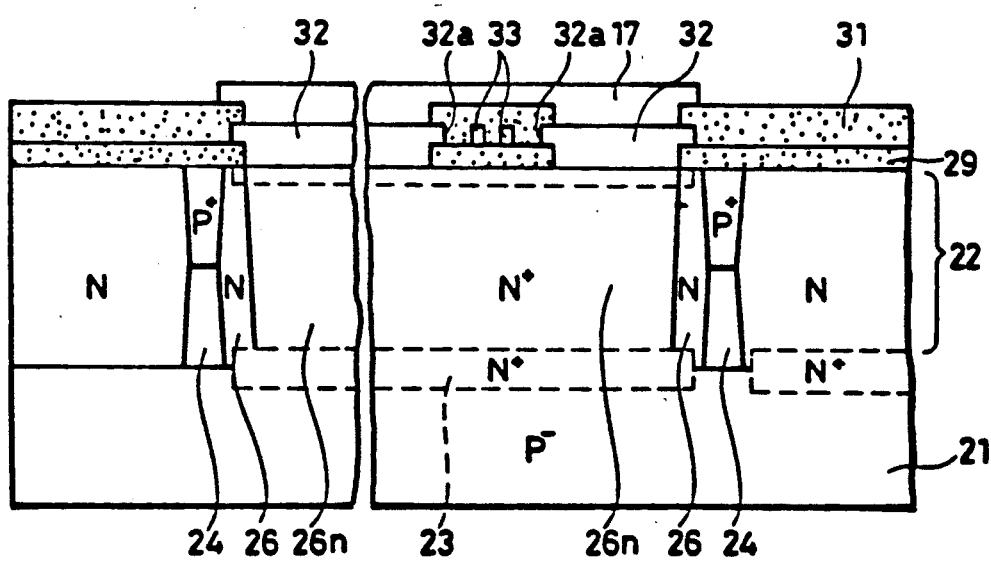
Figure 8C:
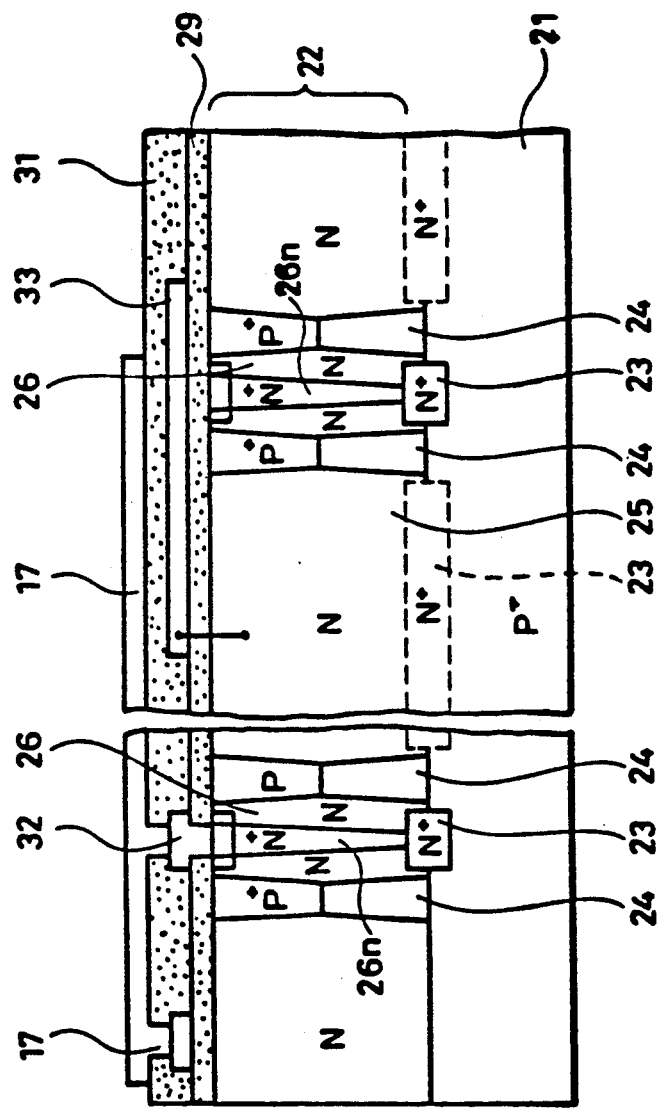

Referring to FIG. 7, a part of a semiconductor IC according to a further embodiment of the present invention is shown as a schematic top view. FIGS. 8A, 8B and 8C are schematic sectional views taken along the lines 8A—8A, 8B—8B and 8C—8C in FIG. 7, respectively. Referring to those figures, a plurality of circuit elements (not shown) are formed in the circuit region 25. The circuit region 25 is surrounded by an N dummy island 26 shown by the broken lines in FIG. 7. A dummy N+ region 26n extending from the upper surface of the epitaxial layer 22 to the burried layer 23 is formed in the dummy island 26.

A reverse bias electrode 32 is provided over almost the entire area of the dummy island 26. However, as shown in FIG. 7, the reverse bias electrode 32 has a plurality of cut portions 32a and it is in ohmic contact with the dummy N+ region through the openings of the oxide film 29 in the hatched regions. Interconnections such as the power supply lines, signal lines and feedback lines between the circuit region 25 and the external regions are formed by conductors 33 extending through the cut portions 32a of the reverse bias electrode 32. Not only the reverse bias electrode 32 and the conductors 33 but also the conductors 30 which interconnect the circuit elements in the circuit region 25 are included in the first conductor layer on the oxide film 29.

The first conductor layer is covered with the interlayer insulating film 31. The shield electrode 17 is formed on the insulating film 31 and it covers the circuit region 25 and the reverse bias electrode 32. As can be seen from FIG. 7, the shield electrode 17 is connected to one electrode pad 34. The respective segments of the reverse bias electrode 32 are connected to the shield electrode 17 through the openings of the interlayer insulating film 31. More specifically, the power supply potential is applied to the reverse bias electrode 32 through the shield electrode 17 and the N dummy island 26 is reversely biased with respect to the P+ isolation regions 24. Consequently, flow of leakage current between the circuit region 25 and the external regions can be effectively prevented. The reverse bias electrode 32 serves also as a shield electrode and it further reduces mutual interference between the circuit blocks due to undesirable radiation.

Accordingly, if the FM front end block 1 for example is formed in the circuit region 25, mutual interference with other circuit blocks can be effectively prevented.

Figure 9A:
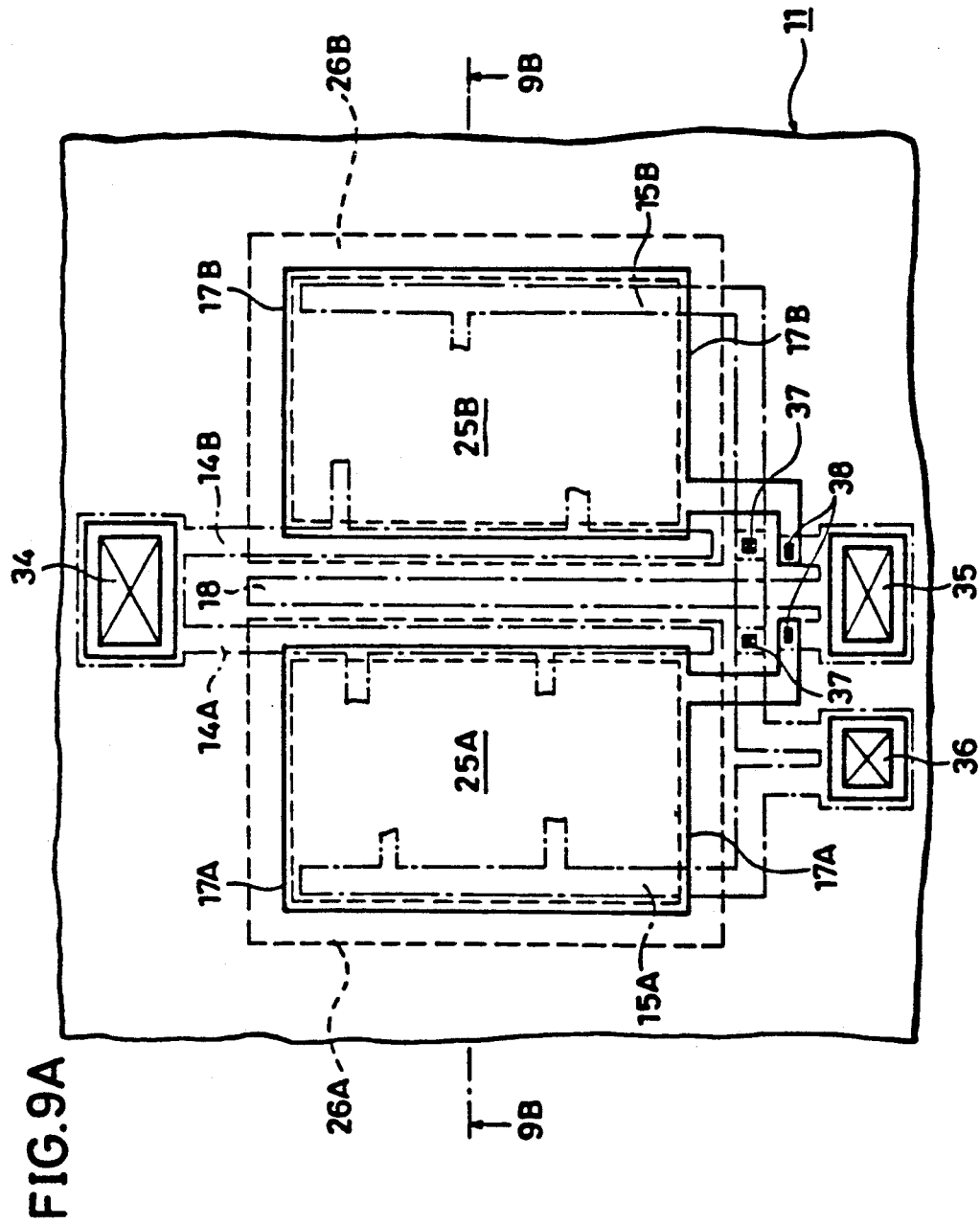
FIG. 9A is a schematic partial top view showing a still further embodiment of the invention.
Figure 9B:
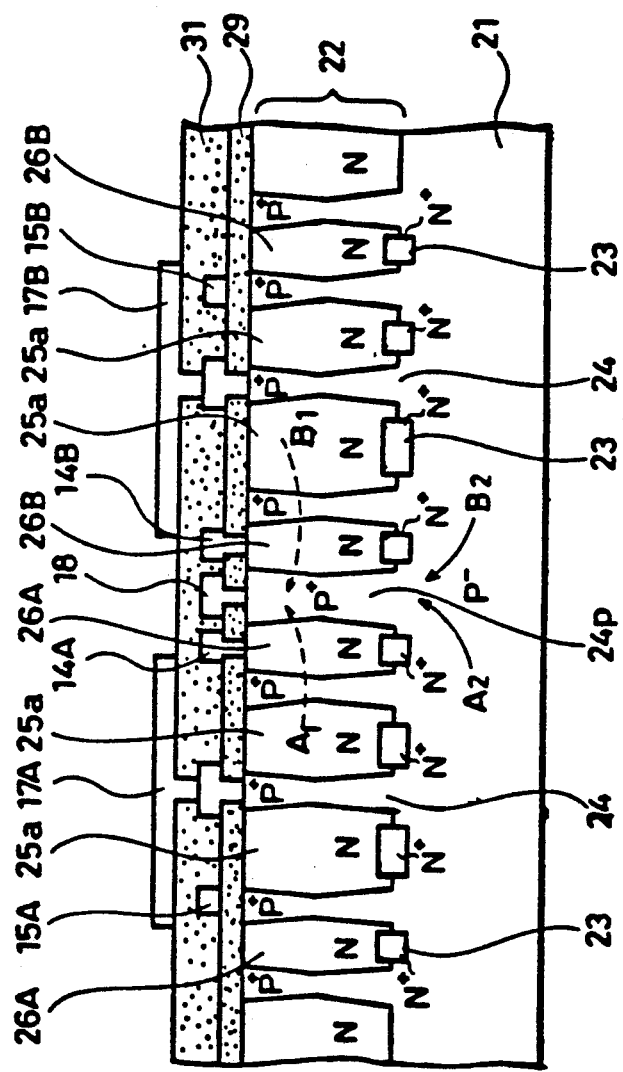
FIG. 9B is a schematic sectional view taken along the line 9B—9B in FIG. 9A.

FIG. 9A is a schematic top view of a part of a semiconductor IC according to a still further embodiment of the invention, and FIG. 9B is a schematic sectional view taken along the line 9B—9B in FIG. 9A. Referring to those figures, two circuit regions 25A and 25B are surrounded by separated N dummy islands 26A and 26B, respectively. Each of the circuit regions 25A and 25B includes a plurality of islands 25a and circuit elements (not shown) are formed in each of the islands 25a. Referring to FIG. 9B, only a limited number of islands 25A are illustrated for the purpose of simplification of the drawing. Portions of the dummy islands 26A and 26B adjacent to each other are isolated by a P+ isolation region 24p.

The absorption electrode 18 formed on the oxide film 29 along the P+ isolation region 24p is connected to the P+ isolation region 24p through the opening of the oxide film. The absorption electrode 18 is also connected to a ground pad 35. Two power supply lines 14A and 14B extend along both sides of the absorption electrode 18 from the power supply pad 34. The power supply lines 14A and 14B are connected to the dummy islands 26A and 26B, respectively, through the openings of the oxide film 29. Further, the power supply lines 14A and 14B have pluralities of branch lines extending into the circuit regions 25A and 25B, respectively, and those branch lines are connected to the circuit elements.

The ground line 15A connected to the circuit elements in the circuit region 25A and the ground line 15B connected to the circuit elements in the circuit region 25B are connected to another ground pad 36 different from the ground pad 35 connected with the absorption electrode 18. Consequently, the absorbed leakage current does not exert any adverse effect on the ground lines 15A and 15B connected to the circuit elements. The absorption electrode 18, the power supply lines 14A, 14B, and the ground lines 15A, 15B are formed substantially in the first conductor layer. However, as shown in FIG. 9A, the ground line 15B is connected to the conductor segments in the second conductor layer through a pair of openings 37 in the interlayer insulating film 31 so that the ground line 15B can cross over the absorption electrode 18.

The shield electrodes 17A and 17B are formed on the interlayer insulating film 31 and those electrodes cover the circuit regions 25A and 25B, respectively. The shield electrodes 17A and 17B are connected to the ground pad 35 through openings 38 in the interlayer insulating film 31. The shield electrodes 17A, 17B are in ohmic contact with the P+ isolation regions in the circuit regions 25A and 25B, respectively through openings penetrating the interlayer insulting film 31 and the oxide film 29, so that those electrodes can absorb leakage current in the circuit region 25A and 25B.

In the semiconductor IC shown in FIGS. 9A and 9B, the lower supply potential is applied to the dummy islands 26A and 26B, while the P+ isolation region 24p is connected to the ground potential. Accordingly, the dummy islands 26A and 26B are reversely biased with respect to the P+ isolation region 24p. Thus, a depletion layer is formed on an interface between the dummy islands 26A, 26B and the P+ isolation region 24p. Consequently, the leakage currents as represented by the broken line arrows A1 and B1 in FIG. 9B are obstructed by the depletion layers and do not enter the P+ isolation region 24p. Thus, increase in the potential of the P+ isolation region 24p can be suppressed. As a result, the P+ isolation region 24p can absorb effectively the leakage currents passing through the P+substrate as shown by the solid line arrows A2 and B2.

Figure 10:
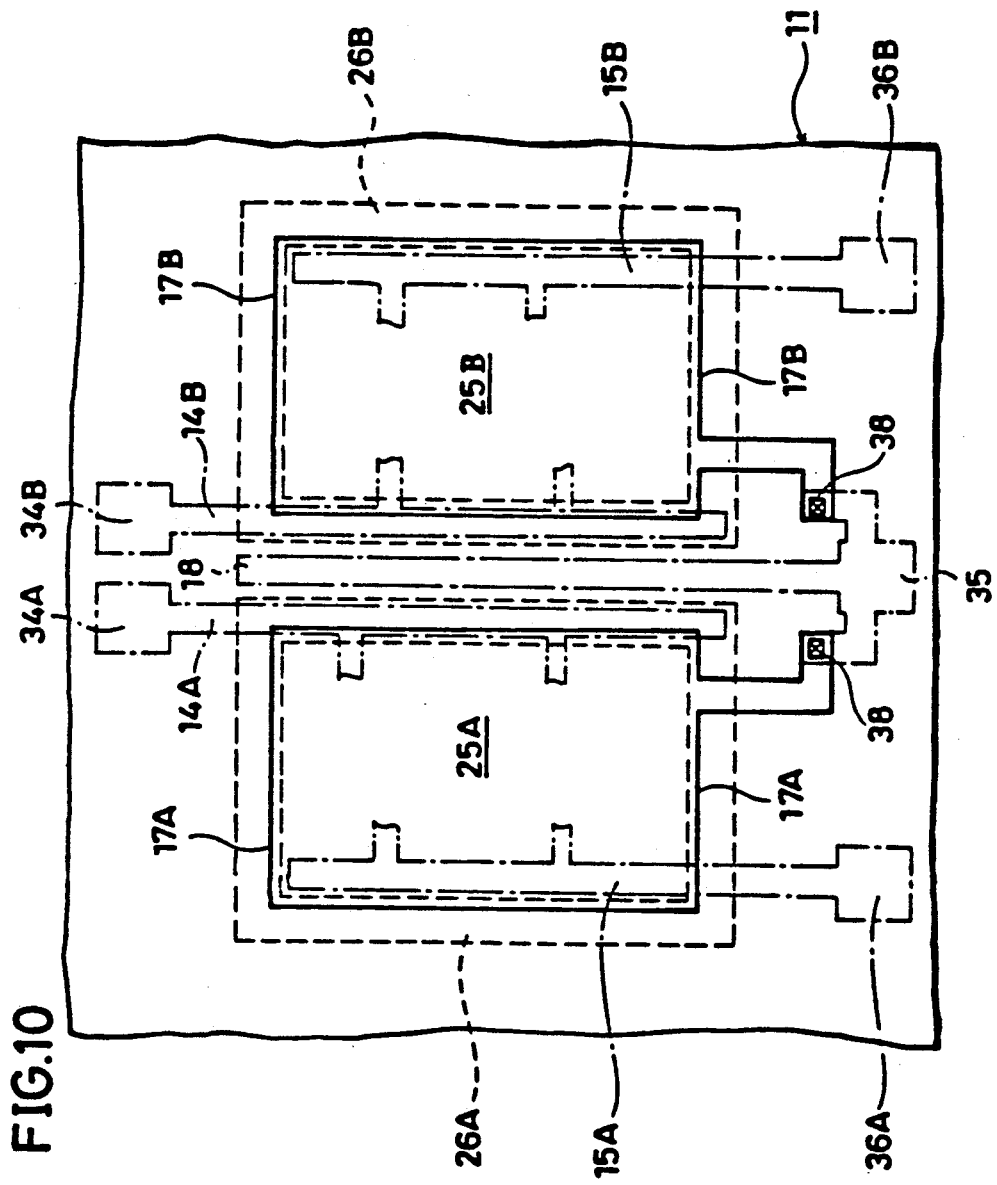
FIG. 10 is a schematic partial top view showing a still further embodiment of the invention.

Referring to FIG. 10, a part of a semiconductor IC according to a still another embodiment of the invention is shown as a schematic top view. The IC in FIG. 10 is similar to that in FIG. 9A, except that two power supply lines 14A and 14B are connected to separated power supply pads 34A and 34B, respectively. Similarly, two ground lines 15A and 15B are connected to separated ground pads 36A and 36B respectively. Accordingly, mutual interference between the power supply lines 14A and 14B for the circuit regions 25A and 25B, and mutual interference between the ground lines 15A and 15B are further reduced.

As described above in detail in connection with the embodiments, according to the present invention, mutual interference between the circuit blocks on the same semiconductor chip can be effectively prevented. Accordingly, an FM front end block of an FM/AM tuner for example can be formed together with other circuit blocks on a single semiconductor chip.

Referring to FIG. 11, an FM/AM receiver including a semiconductor IC to which the present invention is applied is shown as a block circuit diagram. The semiconductor chip 11 comprises an FM front end block 1, an FM-IF amplifying circuit block 2, a noise canceller block 3, a multiplex decoder block 4 and an AM tuner block 5. A tuning circuit 60 selects a frequency for reception and inputs a tuned FM signal to a mixing circuit 1c in the FM front end block 1 or a tuned AM signal to a mixing circuit in the AM tuner block 5. Each of first and second filter circuits 61 and 62 includes an elastic wave filter 63 and samples only an FM-IF signal from an output of the mixing circuit 1c.

A passive circuit 64 defines an oscillation frequency of an oscillation circuit 1b in the FM front end block 1. A quartz oscillator 65 defines an oscillation frequency of a voltage control oscillation circuit in the multiplex decoder block 4. A third filter 66 permits only an AM-IF signal to pass therethrough. A passive circuit 67 defines an oscillation frequency of an oscillation circuit in the AM tuner block 5.

In the FM/AM receiver in FIG. 11, almost all the circuit blocks and circuit elements are included in the single semiconductor IC 11. Accordingly, the FM/AM receiver can be manufactured by combination with a relatively small number of external parts which can not be integrated on the semiconductor chip 11. Thus, the FM/AM receiver to which the present invention is applied can be manufactured at low cost with a reduced number of parts compared with conventional receivers.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:
    a p type semiconductor substrate,
    an n type epitaxial layer formed on said substrate,
    p+ type isolation regions penetrating said epitaxial layer to form a plurality of island regions and at least one dummy island between said island regions,
    semiconductor circuit elements formed in said island regions,
    a plurality of circuit blocks which include said circuit elements,
    at least a first circuit block of said circuit blocks being surrounded by said dummy island,
    a reverse bias electrode for applying a predetermined reverse bias potential to said dummy island,
    a shield electrode covering said first circuit block and connected to said reverse bias electrode, said reverse bias electrode being connected to said dummy island through an opening of a first insulating layer, said shield electrode being connected to said reverse bias electrode through an opening in a second insulating layer, and a conductor led into and out of said first circuit block extends through a cut portion of said reverse bias electrode between said first and second insulating layers.

2. A semiconductor integrated circuit in accordance with claim 1, wherein said reverse bias electrode is in ohmic contact with a high impurity concentration region in said dummy island.

3. A semiconductor integrated circuit in accordance with claim 1, wherein said first circuit block is an FM front end circuit block included in an FM/AM tuner.

* * * * *